(12) United States Patent
Kido

(10) Patent No.: US 10,609,850 B2
(45) Date of Patent: Mar. 31, 2020

(54) BOARD CONVEYANCE DEVICE INCLUDING A LIFTER

(71) Applicant: FUJI CORPORATION, Chiryu (JP)

(72) Inventor: Takashi Kido, Kariya (JP)

(73) Assignee: FUJI CORPORATION, Chiryu (JP)

( * ) Notice: Subject to any disclaimer, the term of this patent is extended or adjusted under 35 U.S.C. 154(b) by 748 days.

(21) Appl. No.: 15/111,583

(22) PCT Filed: Jan. 30, 2014

(86) PCT No.: PCT/JP2014/052061
§ 371 (c)(1),
(2) Date: Jul. 14, 2016

(87) PCT Pub. No.: WO2015/114765
PCT Pub. Date: Aug. 6, 2015

(65) Prior Publication Data
US 2017/0034967 A1 Feb. 2, 2017

(51) Int. Cl.
*H05K 13/00* (2006.01)

(52) U.S. Cl.
CPC ..... *H05K 13/0069* (2013.01); *H05K 13/0061* (2013.01)

(58) Field of Classification Search
CPC .................. H05K 13/0061; H05K 13/0069
See application file for complete search history.

(56) References Cited

U.S. PATENT DOCUMENTS

| | | | | |
|---|---|---|---|---|
| 5,722,527 A | * | 3/1998 | Van Gastel | H05K 13/0061 198/345.1 |
| 6,032,577 A | * | 3/2000 | Doyle | B41F 15/0881 101/129 |
| 6,189,674 B1 | * | 2/2001 | Izumida | B65G 15/10 198/341.01 |
| 6,354,430 B1 | | 3/2002 | Oe | |
| 6,374,729 B1 | * | 4/2002 | Doyle | B41F 15/0881 101/114 |

(Continued)

FOREIGN PATENT DOCUMENTS

| | | |
|---|---|---|
| CN | 101516176 A | 8/2009 |
| CN | 202765819 U | 3/2013 |

(Continued)

OTHER PUBLICATIONS

Combined Office Action and Search Report dated Aug. 9, 2018 in Chinese Patent Application No. 201480074035.8 (with English translation of Office Action and English translation of categories of cited documents), 15 pages.

(Continued)

*Primary Examiner* — Minh N Trinh
(74) *Attorney, Agent, or Firm* — Oblon, McClelland, Maier & Neustadt, L.L.P.

(57) ABSTRACT

Board conveyance device 24 is provided with a pair of conveyor belts 64 for conveying a board; and a lifter 70, 74, 78 that raises a board loaded on the pair of conveyor belts, and, in a state with board S raised by the lifter, a different board, board S', is conveyed by the pair of conveyor belts. Also, a board work system includes such a board conveyance device and a board work device that performs work on the board raised by the lifter of the board conveyance device.

3 Claims, 6 Drawing Sheets

(56) References Cited

U.S. PATENT DOCUMENTS

| | | | |
|---|---|---|---|
| 6,769,534 B2 * | 8/2004 | Lee | H05K 13/0061 198/817 |
| 7,089,655 B2 * | 8/2006 | Isogai | H05K 13/0069 29/739 |
| 2004/0128827 A1 * | 7/2004 | Shimizu | H05K 13/0069 29/739 |
| 2010/0122633 A1 | 5/2010 | Doyle | |
| 2010/0122634 A1 | 5/2010 | Doyle | |
| 2010/0122635 A1 | 5/2010 | Doyle | |
| 2010/0122636 A1 | 5/2010 | Doyle | |
| 2010/0125357 A1 | 5/2010 | Doyle | |
| 2010/0125359 A1 | 5/2010 | Doyle | |
| 2013/0180829 A1 | 7/2013 | Doyle | |
| 2013/0333206 A1 | 12/2013 | Doyle | |
| 2017/0034967 A1 * | 2/2017 | Kido | H05K 13/0069 |

FOREIGN PATENT DOCUMENTS

| | | |
|---|---|---|
| JP | 55-106572 | 7/1980 |
| JP | 7-61556 A | 3/1995 |
| JP | 2001-135986 A | 5/2001 |
| JP | 2001-274594 A | 10/2001 |
| JP | 2002-246793 A | 8/2002 |
| JP | 2003-204193 A | 7/2003 |
| JP | 2004-128400 A | 4/2004 |
| JP | 2006-339238 A | 12/2006 |
| JP | 2008-210824 A | 9/2008 |
| WO | WO 03/063569 A1 | 7/2003 |

OTHER PUBLICATIONS

International Search Report dated Mar. 18, 2014, in PCT/JP2014/052061 filed Jan. 30, 2014.

Extended European Search Report dated Jan. 25, 2017 in patent application No. 14880672.2.

Office Action dated Aug. 25, 2017 in Japanese Patent Application No. 2015-559667 (with unedited computer generated English translation).

Office Action dated Jun. 15, 2018 in European Patent Application No. 14 880 672.2.

* cited by examiner

BOARD CONVEYANCE DEVICE INCLUDING A LIFTER

TECHNICAL FIELD

The present disclosure relates to a board conveyance device for conveying a board and a board work system including the board conveyance device for performing work on the board.

BACKGROUND ART

Board work machines such as electronic component mounters are generally provided with a board conveyance device; boards are loaded and unloaded by the board conveyance device and board work such as mounting of components is performed on a board that is positioned at a predetermined position by the board conveyance device. In a system including such a board work device, for example, in cases in which a board exists for which work by the board work machine is not required, a function whereby that work is skipped is desired in the board conveyance device.

To satisfy this demand, with the electronic component mounter (a type of board work machine) disclosed in the patent literature below, a board conveyance device with two lanes (upper conveyance rail, lower conveyance rail) provided at an upper and a lower level, whereby conveyance is possible at either of the two lanes, is used. Further, with this electronic component mounter, while electronic components are being mounted on a board at the upper lane, a different board is able to be conveyed at the lower lane.

CITATION LIST

Patent Literature

Patent Literature 1
JP-A-2001-135986

SUMMARY

Problem to be Solved

With the board conveyance device disclosed in the above patent literature, switching of the lane by which a board is conveyed is performed by raising/lowering the two lanes together, That is, the board conveyance device is provided with two lanes capable of conveying a board, and a raising/lowering mechanism that raises/lowers those two lanes, thus the configuration is relatively complex and it cannot be said that the board conveyance device has high practicality. The present disclosure takes account of the above and an object thereof is to provide a board conveyance device with high practicality; and a board work system with high practicality by using the board conveyance device.

Means for Solving the Problem

To solve the above problem, the present disclosure is a board conveyance device provided with a pair of conveyor belts for conveying a board; and a lifter that raises the board loaded on the pair of conveyor belts so as to separate the board from the pair of conveyor belts, and lowers the raised board so as to load the board on the pair of conveyor belts; wherein, in a state with the board raised by the lifter, a different board is conveyed by the pair of conveyor belts. Also, the present disclosure is a board work system including the board conveyance device of the disclosure and a board work device that performs work on the board raised by the lifter of the board conveyance device.

Effects

According to the board conveyance device of the present disclosure, with a board raised from the pair of conveyor belts by a lifter, a different board is conveyed by the pair of conveyor belts. That is, it is possible to perform passing through of the different board even though the configuration is simple and only one conveyance lane is provided. Note that, if work is to be performed on the board raised by the lifter, the other board can be passed though while work is being performed on the first board. Accordingly, these advantages mean the board conveyance device of the present disclosure has high practicality. Also, according to the board work system of the present disclosure, it is possible to make sufficient use of the advantages of the board conveyance device of the present disclosure.

DESCRIPTION OF EMBODIMENTS

Hereinafter, a representative embodiment of the present disclosure is described with reference to the drawings. A different embodiment of the present disclosure is also described simply as an alternative embodiment. Note that, the present disclosure is not limited to the embodiment and alternative embodiment described above, and various modifications and improvements may be performed based on knowledge of a person skilled in the art.

Embodiments

[A] Configuration of the Board Work System and Component Mounter

Figure 1:
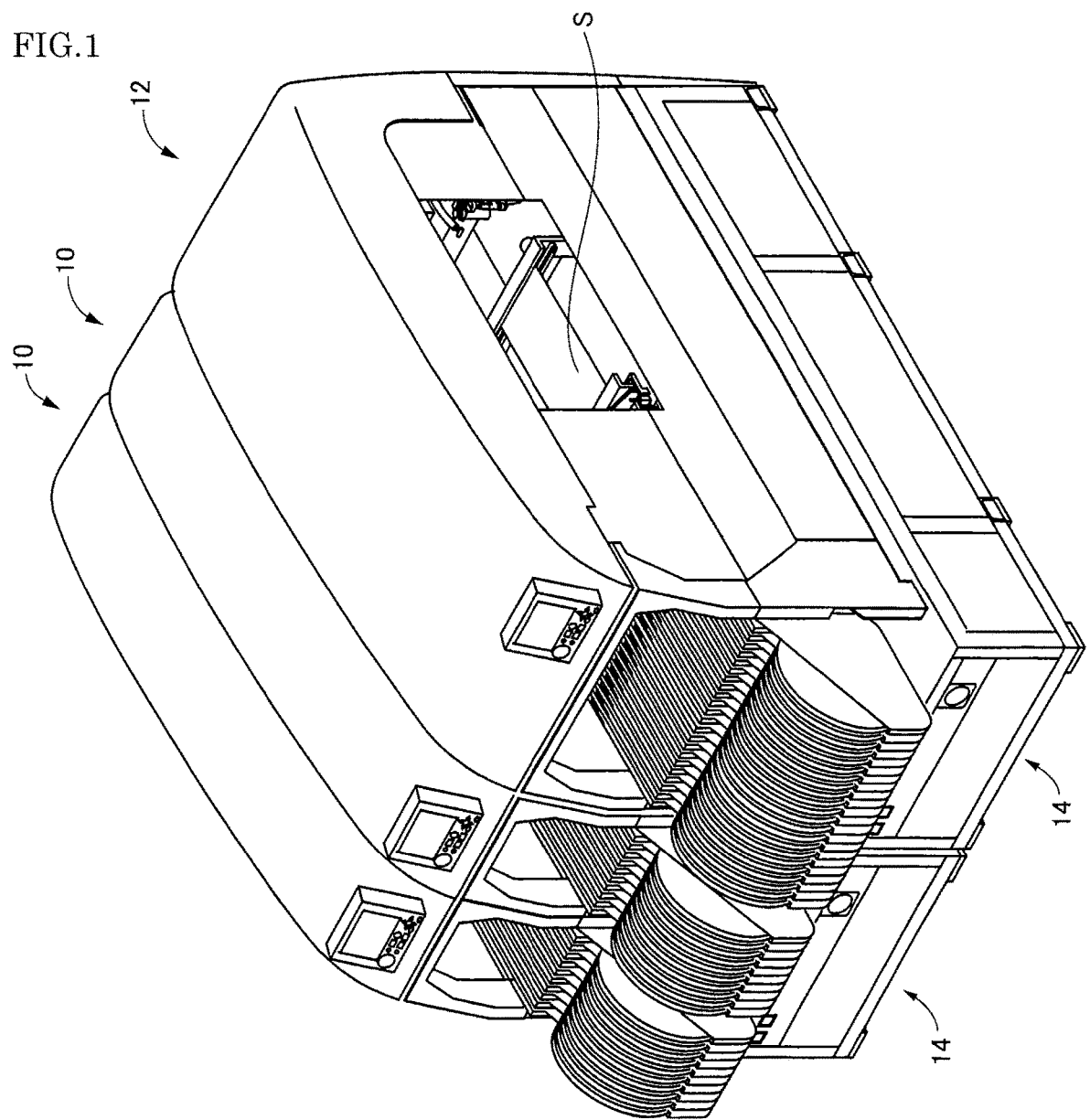
FIG. 1 is a perspective view of an embodiment of the board work system including an embodiment of the board conveyance device.

A board work system which is an embodiment of the present disclosure is a component mounting system for mounting electronic components (also referred to as simply "components") on a board, and, as shown in FIG. 1, is configured from three board work machines—component mounters 10 and component mounters 12. Referring to the left rear of the figure as the upstream side, the right front as the downstream side, the left front as the front side, and the right rear as the rear side, with the present component mounting system, two component mounters 10 are provided on the upstream side, and a relatively wide component mounter 12 is provided on the downstream, with each being arranged next to adjacent to another on two system bases 14.

A circuit board (hereinafter sometimes referred to as simply a "board") that is a configuration element of an electronic circuit is conveyed from the upstream side to the downstream side, that is, in the direction of conveyance for the board (also referred to as "conveyance direction") inside component mounters 10 and 12, and component mounting work (a type of board work) is performed by those component mounters 10 and 12 with respect to the conveyed board such that mounting of components on the board is completed. By consecutively conveying multiple boards inside the system in the conveyance direction, component mounting to each of the multiple boards is completed in order. Note that, the present board work system may be arranged in an electronic circuit manufacturing line along with a solder printer that prints solder paste onto the board, an inspection machine that inspects the work results of the solder printer and the component mounters 10 and 12, a reflow oven that melts the solder thereby fixing the components to the board, and so on.

Figure 2:
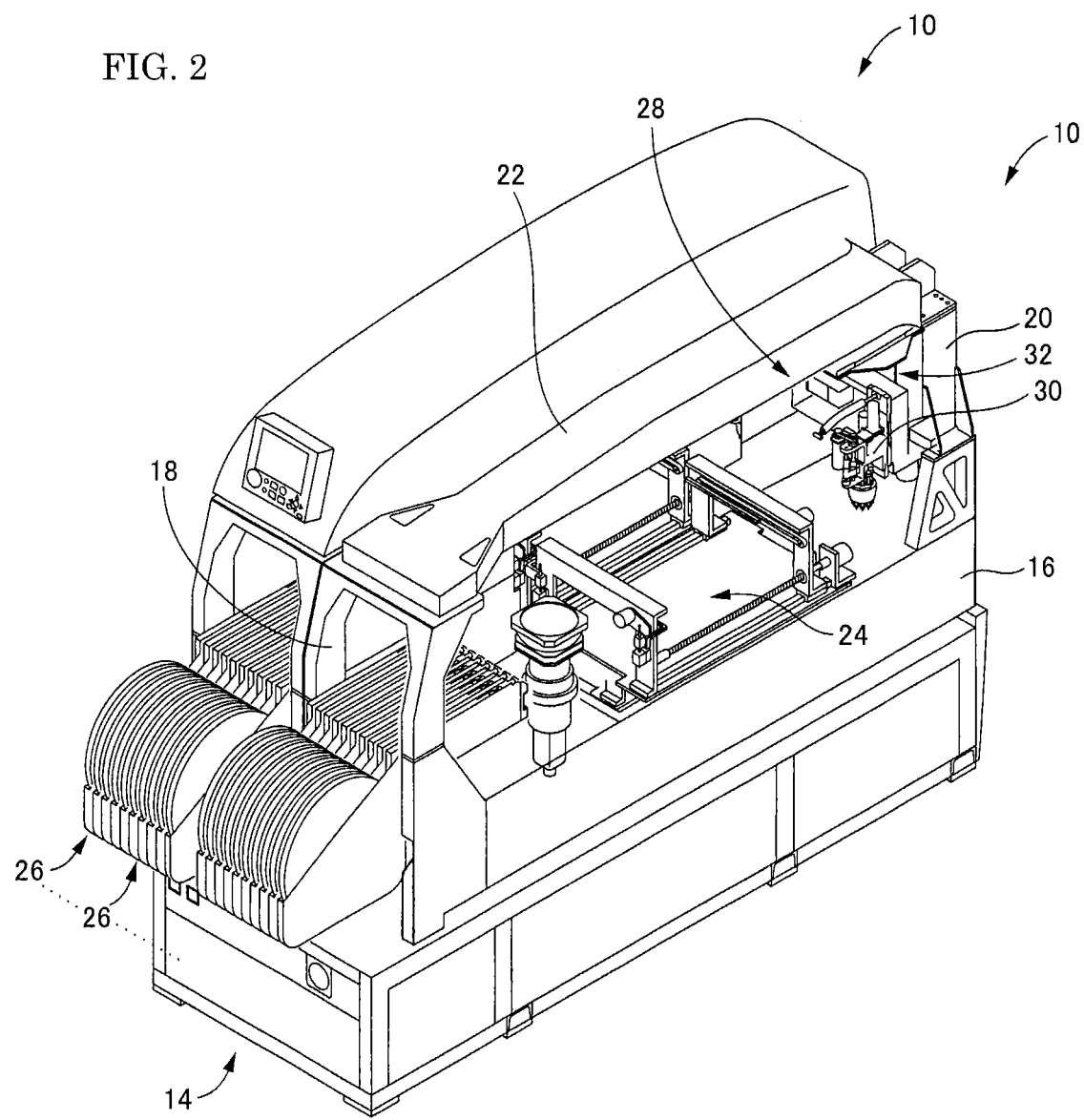
FIG. 2 is a perspective view showing the overall configuration of an electronic component mounter configured from the embodiment of the board work system.

As shown in FIG. 2; the two component mounters 10 arranged at the upstream side have the same configuration as each other and are arranged on one system base 14, To describe downstream side component 10 with the outer panels removed as in fig., each component mounter 10 includes base 16, frames 18 and 20 erected on base 16 at the front and rear ends, and beam 22 provided on those frames 18 and 20; together these items configure the body of component mounter 10.

Conveyor device 24, which is an embodiment of the board conveyance device, is provided on base 16. The configuration is described later, but conveyor device 24 functions to load a board from the upstream side and unload the board to the downstream side, and functions to fix the board at a set work position. Note that FIG. 1 shows board S fixed in the work position by conveyor device 24.

Multiple component feeders 26, which function as component supply devices, are lined up at the front side of conveyor device 24. Note that, each component feeder 26 is a so-called tape feeder, Component mounting device 28, which is a type of board work device, is supported on beam 22. Component mounting device 28 is configured from mounting head 30, which is a type of work head, and head moving device 32, which is an XY-robot type that moves mounting head 30 forward/back/left/right, Mounting head 30 is provided with multiple suction nozzles, which are a component holding tool that picks up and holds a component, and a nozzle raising/lowering mechanism that raises/lowers one of those multiple suction nozzles.

Component mounting work, which is a type of board work, is performed by component mounting device 28 with respect to the board that is fixed at the work position by conveyor device 24. During component mounting work, mounting head 30 is moved above component feeder 26, a component is picked up and held by a suction nozzle, then mounting head 30 is moved above a board and the component held by the suction nozzle is mounted on the top surface of the board.

Figure 3:
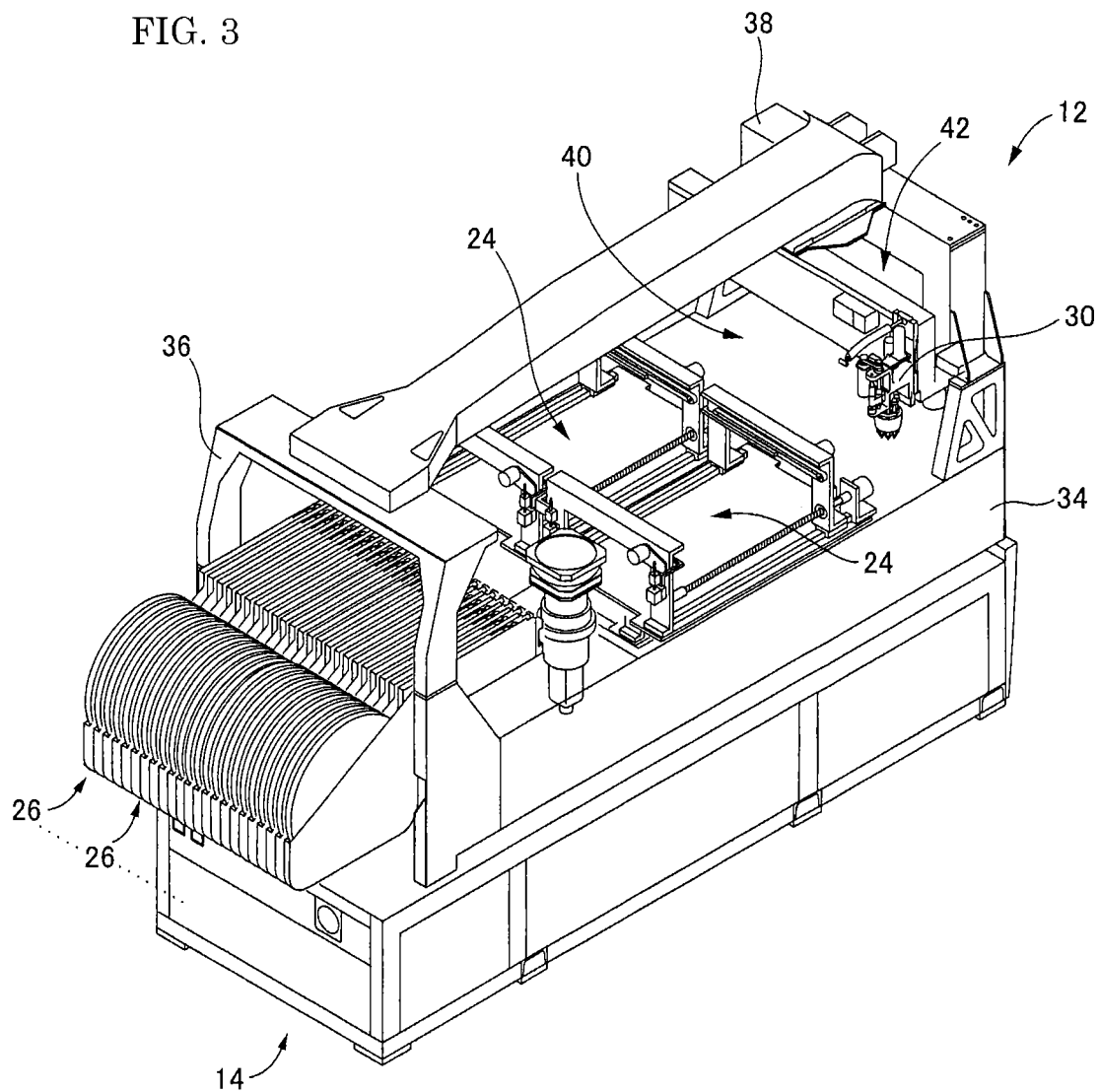
FIG. 3 is a perspective view showing the overall configuration of a different electronic component mounter configured from the embodiment of the board work system.

Component mounter 12 arranged at the downstream side is arranged on one system base 14, and as shown by component mounter 12 in FIG. 3 with the outer panels removed, includes base 34 and frames 36 and 38 that have a larger dimension in the conveyance direction. Also, two conveyor devices 24 the same as that arranged inside component mounter 10 are arranged in component mounter 12 lined up in the conveyance direction. The two conveyor devices 24 are configured to work together to convey one board, and the work position described above is set in both the two conveyor devices 24. Component mounting device 40 (a type of board work device) of component mounter 12, by having head moving device 42 with a large movement range for mounting head 30 in the conveyance direction, allows mounting head 30 to be moved further in the conveyance direction compared to component mounting device 28 of component mounter 10. Due to this configuration component mounter 12 is able to perform component mounting work at either of two work positions. In other words, component mounter 12 is able to perform the same component mounting work at two stages.

[B] Conveyor Device Configuration and Functions

Figure 4:
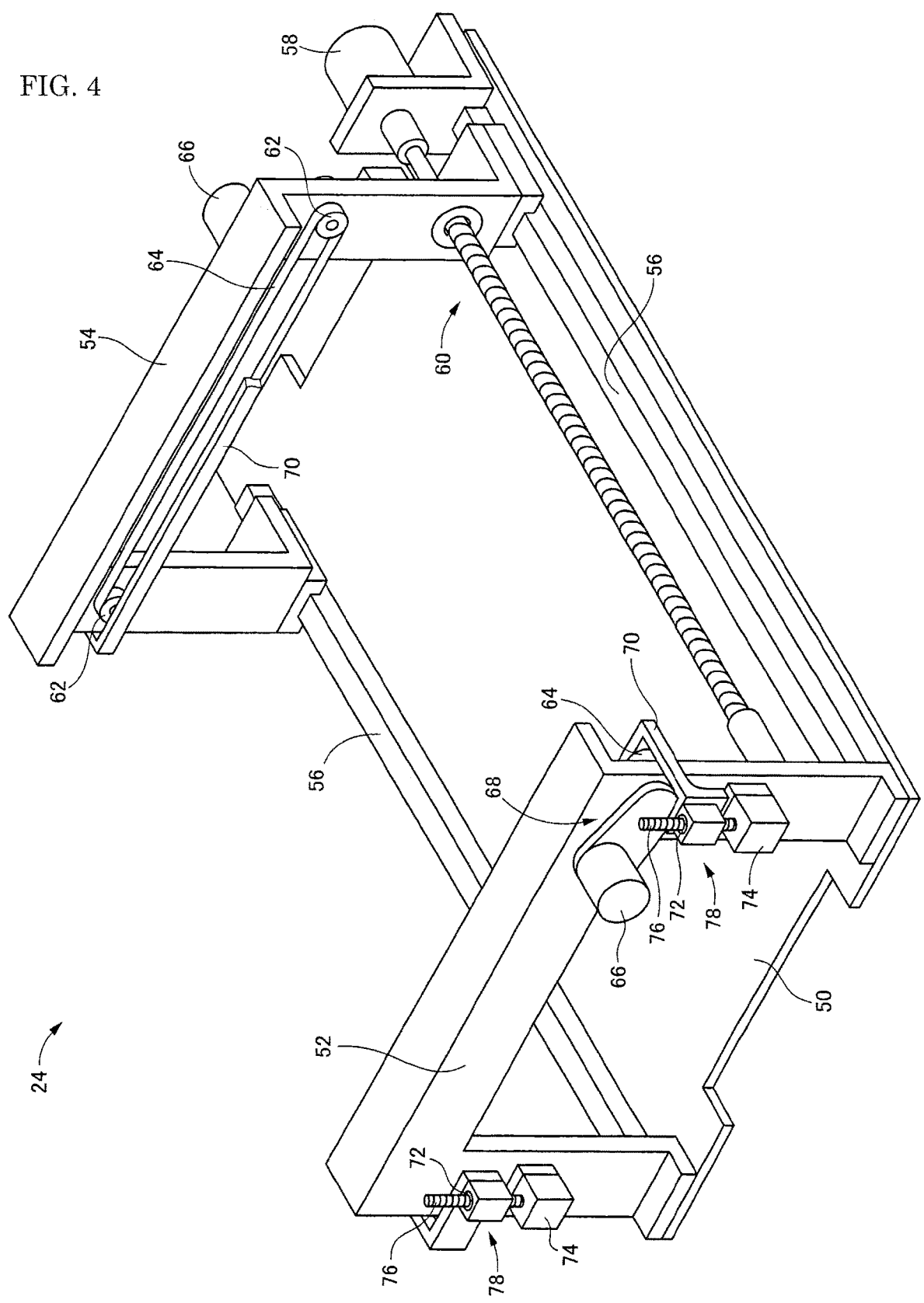
FIG. 4 is a perspective view showing an embodiment of a board conveyance device used in an electronic component mounter.

As shown in FIG. 4, conveyor device 24 includes base plate 50 and a pair of support frames 52 and 54 which are substantially plate-shaped and are erected at either end of base plate 50 in a direction perpendicular to the conveyance direction, that is, at the front end and the rear end of base plate 50. Front side support frame 52 is fixed to base plate 50 while rear side support frame 54 is movable in a front/rear direction along a pair of guide rails 56 arranged on base plate 50. Rear side support frame 54 is moved forward/back by moving mechanism 60 that includes motor 58 as a drive source based on the width in the front/rear direction of the board being conveyed. As understood from the drawing, moving mechanism 60 is configured from a ball screw mechanism.

A pair of pulleys 62 is rotatably provided on an internal surface of each of support frames 52 and 54 (these surfaces face each other). One of the pair of pulleys 62 is arranged at the upstream end in the conveyance direction of support frame 52 (54), and the other is arranged at the downstream end. Also, conveyor belt 64 is wound around the pair of pulleys 62, The downstream side pair of pulleys 62 is rotated by rotation mechanism 68 configured from motor 66 as a drive source and a gear train, and conveyor belt 64 is moved by that rotation. That is, conveyor device 24 is provided with a pair of conveyor belts 64, and in a state with edges of a board in the front/rear direction loaded on the pair of conveyor belts 64, the board is conveyed in the conveyance direction.

Also, as a support tool capable of supporting from below a board loaded on the pair of conveyor belts 64, support bar 70 is raisably/lowerably provided on support frames 52 and 54 between the pair of conveyor belts 64, that is, close to each of the supporting conveyor belts 64. Note that, in FIG. 4, a portion of support bar 70 provided on rear side support frame 54 is omitted. Support bar 70 extends in the conveyance direction along support frame 52 (54), and both ends of each support bar 70 protrude to the outside of support frame 52 (54) in the conveyance direction, and are formed to come around the outside surface (the surface on the back side of the support frame). Nut 72 is non-rotatably provided on both ends of each support bar 70. A pair of motors 74 is attached to each support frame 52 and 54 on an outside surface at both ends in the conveyance direction, and the rotating shaft of each of the pairs of motors 74 is screw rod 76, which has an axis line extending the up/down direction, Each screw rod 76 is engaged with nut 72 provided at each end of support bar 70, and a pair of screw mechanisms 78 are configured from the pair of nuts 72 and the pair of screw rods 76. As is clear from the above configuration, one support bar 70 is raised/lowered by the rotation of a pair of motors 74. That is, a support tool raising/lowering mechanism that raises support bar 70; which is the above support tool, is configured from the pair of screw mechanisms 78 and the pair of motors 74 that act as a drive source.

Figure 5A:
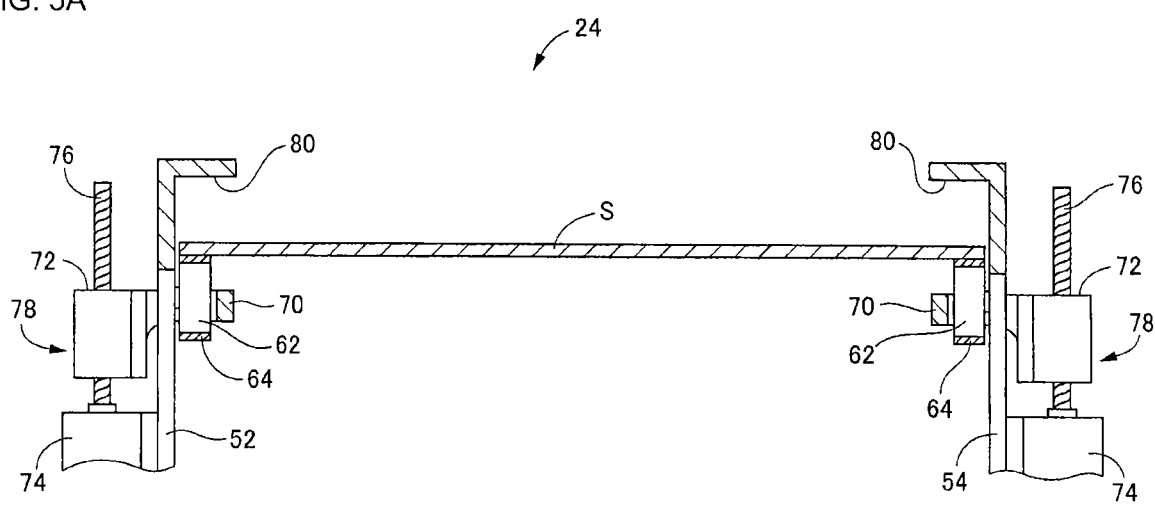
FIG. 5 shows operation of the embodiment of the board conveyance device.

To explain further, as shown in FIG. 5A, board S is conveyed in the conveyance direction with both edges in a front/rear that is horizontal and perpendicular to the conveyance direction loaded on an upper surface of the pair of conveyor belts 64. Here, each of the pair of support bars 70 is positioned on the inside of the pair of conveyor belts 64 at a position lower than the upper surface of the pair of conveyor belts 64 in the up/down direction. Thus, the pair of support bars 70 does not obstruct the conveyance of board S.

Figure 5B:
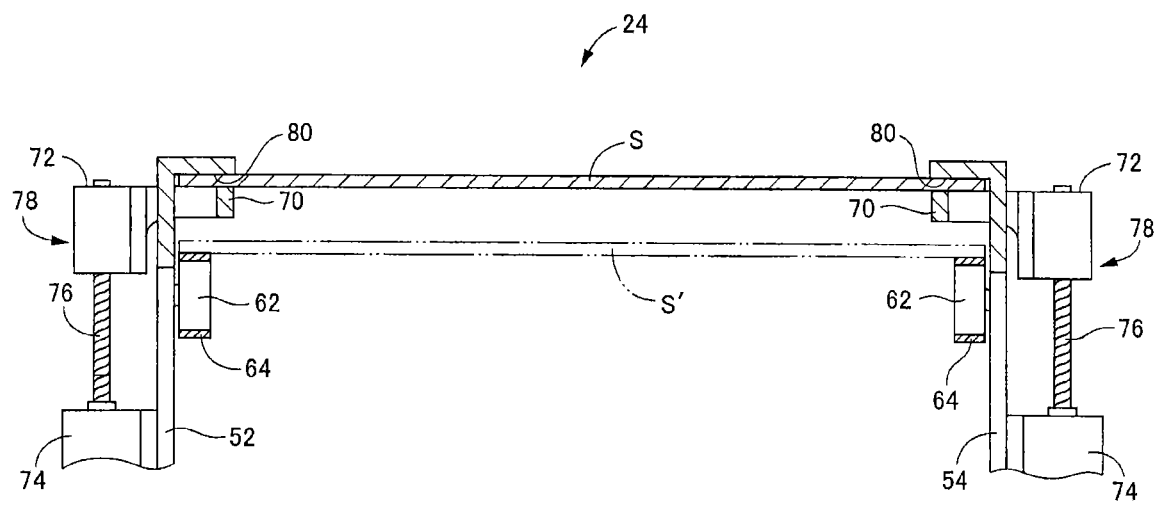
Figure 6A:
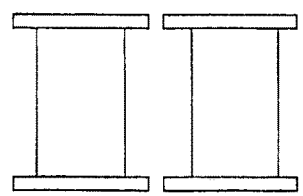
FIG. 6 conceptually shows the movement of a board during specific operation performed by the embodiment of the board work device.
Figure 6B:
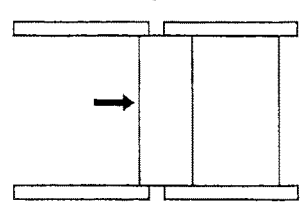
Figure 6C:
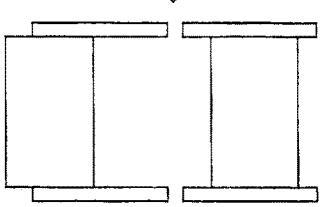
Figure 6D:
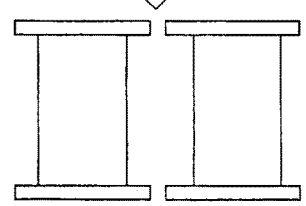
Figure 6E:
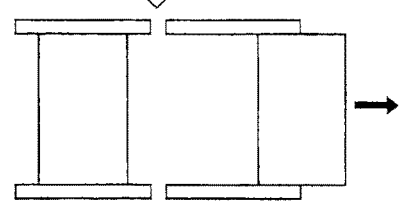
Figure 6F:
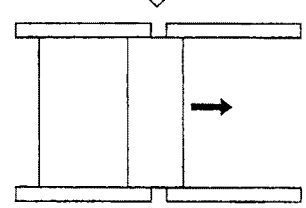
Figure 6G:
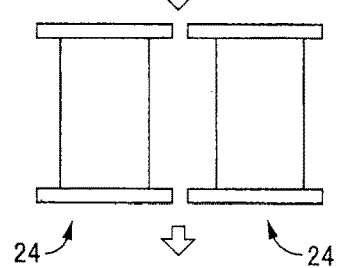

When the pair of support bars 70 are raised by the rotation of the four motors 74, as shown in FIG. 5B, board S is raised so as to be separated from the pair of conveyor belts 64 in a state supported from below by the pair of support bars 70. Flange 80 that protrudes to the inside is formed on the upper section of each of support frames 52 and 54. The pair of flanges 80 function as a stopper that stops the raised board S at a position above the pair of conveyor belts. The edges of raised board S are fixed by being sandwiched between the pair of flanges 80 and the pair of support bars 70. Component mounting work is performed by component mounting device 28 (40) with respect to the sandwiched board. That is, a board fixing mechanism is configured including a configuration that sandwiches board S by the pair of flanges 80 and the pair of support bars 70, so as to fix board S in a work position that is a position at which work is performed with respect to board S, Further; board S on which component mounting work has been performed, that is, board S that has been raised, is lowered so as both edges of board S are loaded on the pair of conveyor belts 64 by the pair of support bars 70 being lowered by the rotation of the four motors 74. According to the above configuration, conveyor device 24 includes the pair of support bars 70 and the above pair of support tool raising/lowering mechanisms, which is configured as a lifter that raises and separates from the pair of conveyor belts a board loaded on the pair of conveyor belts, and that lowers the raised board so that the board is loaded on the pair of conveyor belts.

As shown in FIG. 5B, with conveyor 24, in a state with board S raised, each support bar 70 and each conveyor belt 64 are separated in the up/down direction, and there is a space below the pair of support bars 70 and above the pair of conveyor belts 64. By using this space, a function in which board S' (shown by the 2-point dashed line) that is different to the raised board S is conveyed by the pair of conveyor belts 64 is realized (also referred to as the "different board conveyance function"). Thus, with the present board work system that uses the present conveyor device 24, in a case in which multiple boards are conveyed in order, by using the above different board conveyance function, the conveyance order of the multiple boards is able to be changed, that is, passing through of boards is possible.

Also, with conveyor device 24, in a case where board S is in a raised state, a different board, board S', is able to be conveyed by the pair of conveyor belts while component mounting work is being performed with respect to board S by component mounting device 28 (40), that is, while board work is being performed with respect to board S. Thus, according to the present board work system that uses conveyor device 24, it is possible to perform the above passing through of a board while performing board work.

[C] Operations Related to Board Conveyance Performed at the Board Work System

Each component mounter 10 and 12 includes a control device that controls component mounting device 28 (40) and the one or two conveyor devices 24 provided on the respective component mounter 10 or 12, and various operations using the above different board conveyance function are performed based on the control of the control device. These operations are described below.

i) Pass-Through Operation

In pass-through operation, while work is performed by a specified component mounting device 28 (40) with respect to one board, a different board that does not require work by that component mounting device 28 (40) is conveyed, without that work being performed, by conveyor device 24 provided on component mounter 10 (12) that is provided with that component mounting device 28 (40). Simply put, this is operation to skip work by the specified component mounting device 28 (40).

Pass-through operation is effective in, for example, cases in which the above different panel is specified as a work defect board for which the result of work by a specified component mounting device 28 (40) that is an upstream board work device was defective, such that component mounting work on that board by component mounting device 28 (40) has become unnecessary, and ii) cases in which the result of work by a specified component mounting device 28 (40) that is a downstream board work device is defective, such that it is desirable to perform only the work according to that board work device again. In the above cases, by performing pass-through operation, it is possible to perform suitable measures for the circumstances such that there is no substantial impediment with respect to another board, that is, there is no substantial decrease in the productivity of the board work system.

ii) Alternating Work Operation

Alternating work operation is effective operation in, for example, cases in which the productivity of the board work system should be improved by having the two component mounters 10 perform the same component mounting work as each other with respect to multiple boards that are conveyed consecutively. In this alternating work operation, a) upstream work operation in which, after work is performed by component mounting device 28 of upstream component mounter 10 with respect to one of the multiple boards conveyed consecutively, work by component mounting device 28 of downstream component mounter 10 is skipped with respect to that board, and b) downstream work operation in which, after work by component mounting device 28 of upstream component mounter 10 is skipped with respect to a different board, work is performed by component mounting device 28 of downstream component mounter 10 with respect to that board, are performed alternately. According to this operation, with the present board work system, even with two component mounters 10 arranged serially, the same productivity as a board work system with two component mounters that perform the same work as each other arranged in parallel, that is, a board work system in which two component mounters are arranged in parallel in a direction perpendicular to the conveyance direction, is achieved. That is, a high productivity system is achieved with a system that has a small dimension in the front/rear direction, which is a direction perpendicular to the conveyance direction.

Also, alternating work operation is effective operation in, for example, cases in which the productivity of the board work system should be improved by having component mounters 12 perform the same component mounting work as each other with respect to multiple boards that are conveyed consecutively. In this alternating work operation, A) upstream work operation in which, after work is performed by component mounting device 40 at upstream conveyor device 24 with respect to one of the multiple boards conveyed consecutively; the board is conveyed by the upstream conveyor device 24 without performing the work by component mounting device 40 at upstream conveyor device 24, and B) downstream work operation in which, after a different board is passed through the conveyor device 24 without performing work by component mounting device 40 at upstream conveyor device 24 with respect to the different board, work is performed by component mounting device 40 at downstream conveyor device 24. According to this operation, because loading of a board, fixing of a board to a work position, and unloading of a board of one of the two conveyor devices 24, is able to be performed while component mounting device 40 is performing component mounting work with respect to a different board held by the other of the two conveyor devices 24, it is possible to reduce considerably the time that component mounting device 40 is not performing component mounting work. As a result, the board work system has high productivity.

Note that, movement of boards during the above two alternating work operations is shown conceptually in FIG. 6. FIG. 6A shows a board raised to the work position by the lifter described above at each of the two conveyor devices 24, with component mounting work being performed with respect to both of the boards. FIG. 6B shows a board for which work at upstream conveyor device 24 is complete being passed through by the conveyor device 24 such that the board goes under a board for which work is being performed at downstream conveyor device 24, with the board being unloaded to the downstream side of conveyor 24. FIG. 6C shows a new board being loaded to the empty upper stream conveyor 24 by that conveyor 24. FIG. 6D shows component mounting work being performed with respect to both boards in a similar way to FIG. 6A. FIG. 6E shows a board for which work at downstream conveyor 24 is complete being unloaded to the downstream side of that conveyor device 24. FIG. 6F shows a new board being loaded to the empty downstream conveyor device 24 with the new board being passed through under a board at which work is being performed by upstream conveyor device 24. FIG. 6G shows the same state as FIG. 6A. With the present board work system, by repeating these states, component mounting work is performed consecutively with respect to multiple boards.

Accordingly, the present board work system that repeats the above states is configured to perform I) a first operation in which, while performing work by two upstream component mounting devices 28 or one component mounting device 40 with respect to a board raised by the lifter of upstream conveyor device 24, a different board is loaded to downstream conveyor device 24 by that upstream conveyor device 24, that different board is raised by the lifter of that downstream conveyor device, and work is performed by two downstream component mounting devices 28 or one component mounting device 40 with respect to that board, and II) a second operation in which a board, which was raised by the lifter of upstream conveyor device 24 and on which work has been completed by two upstream component mounting devices 28 or one component mounting device 40, is loaded by downstream conveyor device 24 while work is performed by two downstream component mounting devices 28 or one component mounting device 40 with respect to a board raised by the lifter of that downstream conveyor device 24, alternately.

Alternative Embodiment

With the above conveyor device 24, the lifter is configured to include the pair of front/rear support bars 70 that are each a support tool, however, the lifter that raises/lowers the board may be configured from only one support tool. Also, with the above conveyor device 24, the support tool raising/lowering mechanism is configured to raise/lower support bar 70 at both ends in the conveyance direction of support bar 70, which is a support tool, however, the configuration may be such that the support tool is raised/lowered at one end of the support tool. That is, the board conveyance device configured to include the lifter is not limited to any particular construction so long as the configuration is such that with a board in a raised state, a different board is able to be conveyed under the raised board by the pair of conveyor belts.

Also, with the above conveyor device 24, for further convenience of component mounting work, a board fixing mechanism that fixes the raised board is provided, however, it is acceptable not to provide a board fixing device for the board conveyance device so long as board work by the board work device is able to be performed to a satisfactory level, or if board work is not to be performed at that board conveyance device. For example, in a case in which board work is not to be performed by the board conveyance device in question, it is still possible to perform the above board pass-through operation, thus a board work system using this kind of board conveyance device has sufficient practicality.

The above conveyor device 24 uses component mounters 10 and 12 that perform component mounting work as board work, however the board work machines are not limited to component mounters, and the board conveyance device of the present disclosure can readily be used in, for example, a printer that performs solder printing work, or an inspection machine that inspects the result of solder printing work or component mounting work as board work.

REFERENCE SIGNS LIST

10: component mounter (board work machine); 12: component mounter (board work machine); 24: conveyor device (board conveyance device); 28: component mounting device (board work device); 40: component mounting device (board work device); 64: conveyor belt; 70: support bar (support tool) (lifter); 74: motor (support tool raising/lowering mechanism) (lifter); 78: screw mechanism (support tool raising/lowering mechanism) (lifter); 80: flange (stopper) (board fixing mechanism); S, S': board

The invention claimed is:
1. A conveyance device operatively associated with a board comprising:
 a pair of conveyor belts each of which edges of the board are loaded on, that convey the board in a conveyance direction by the conveyor belts moving; and
 a lifter that raises the board loaded on the pair of conveyor belts so as to separate the board from the pair of conveyor belts, and lowers the raised board so as to load the board on the pair of conveyor belts,
 wherein a space is located below the raised board such that a different board conveyed by the pair of conveyor belts is configured to be conveyed into the space,
 wherein the lifter includes a support tool provided between the pair of conveyor belts extending in the conveyance direction with at least one end protruding outside the pair of conveyor belts configured to support the board loaded on the pair of conveyor belts from below, and a support tool raising and lowering mechanism that raises and lowers the support tool at at least one end of the support tool, and wherein the board conveyance device conveys the different board using the pair of conveyor belts under the support tool raised by the support tool raising and lowering mechanism.

2. The conveyance device according to claim 1, further provided with
a board fixing mechanism that fixes the board raised by the lifter at a work position at which work is performed on the board.

3. The conveyance device according to claim 1, further provided with
a stopper that stops the board raised by the lifter at a position above the pair of conveyor belts, wherein
the board is fixed at a work position, at which work is performed on the board, by the board being sandwiched between the stopper and the support tool.

* * * * *